United States Patent
Shinozaki

(10) Patent No.: US 10,534,040 B2
(45) Date of Patent: Jan. 14, 2020

(54) INSPECTION APPARATUS AND INSPECTION METHOD FOR MEMBRANE ELECTRODE ASSEMBLY

(71) Applicant: TOYOTA JIDOSHA KABUSHIKI KAISHA, Toyota-shi, Aichi (JP)

(72) Inventor: Kazuma Shinozaki, Nagoya (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 24 days.

(21) Appl. No.: 15/937,324

(22) Filed: Mar. 27, 2018

(65) Prior Publication Data
US 2018/0292464 A1 Oct. 11, 2018

(30) Foreign Application Priority Data
Apr. 6, 2017 (JP) ................. 2017-076267

(51) Int. Cl.
*G01R 31/392* (2019.01)
*H01M 8/04664* (2016.01)
(Continued)

(52) U.S. Cl.
CPC ......... *G01R 31/392* (2019.01); *G01R 31/385* (2019.01); *H01M 8/04664* (2013.01);
(Continued)

(58) Field of Classification Search
CPC ............... G01R 31/392; G01R 31/385; H01M 8/04664; H01M 8/1004; H01M 8/1018; H01M 2008/1095
(Continued)

(56) References Cited

U.S. PATENT DOCUMENTS

| 2004/0048113 A1* | 3/2004 | Murphy | B01D 65/104 429/431 |
| 2013/0026096 A1* | 1/2013 | Nitta | C02F 1/006 210/638 |
| 2015/0114849 A1 | 4/2015 | Oda et al. | |

FOREIGN PATENT DOCUMENTS

| JP | 2010-067531 A | 3/2010 |
| JP | 2015-084291 A | 4/2015 |

(Continued)

*Primary Examiner* — Melissa J Koval
*Assistant Examiner* — Trung Nguyen
(74) *Attorney, Agent, or Firm* — Dickinson Wright, PLLC

(57) ABSTRACT

Provided are an inspection apparatus and method capable of accurately detecting a defective membrane electrode assembly based on the rate of deterioration of carbon forming an electrode catalyst layer or the like of the assembly. The apparatus is an inspection apparatus for a membrane electrode assembly including an electrolyte membrane and anode-side and cathode-side electrode catalyst layers made of carbon materials to form a fuel cell, the apparatus including a voltage application unit that applies voltage to the assembly; and a measurement and operation determination unit that measures a time history waveform of current that flows upon application of the voltage for an inspection time and calculates the time integral value of current for the inspection time, and compares the time integral value of current with a threshold of the time integral value of current preset based on a predetermined carbon deterioration rate so as to determine the assembly to be defective if the time integral value of current is greater than the threshold.

4 Claims, 6 Drawing Sheets

(51) Int. Cl.
*H01M 8/1018* (2016.01)
*H01M 8/1004* (2016.01)
*G01R 31/385* (2019.01)

(52) U.S. Cl.
CPC ....... *H01M 8/1004* (2013.01); *H01M 8/1018* (2013.01); *H01M 2008/1095* (2013.01)

(58) Field of Classification Search
USPC ....... 324/432, 500, 555, 425, 444–449, 515, 324/559, 600, 660, 661, 668, 755.09; 429/45, 400–435, 483, 511; 156/64, 350, 156/351, 378, 379
See application file for complete search history.

(56) References Cited

FOREIGN PATENT DOCUMENTS

| | | |
|---|---|---|
| JP | 2016-081596 A | 5/2016 |
| JP | 2016-207523 A | 12/2016 |
| JP | 2017-015560 A | 1/2017 |

\* cited by examiner

INSPECTION APPARATUS AND INSPECTION METHOD FOR MEMBRANE ELECTRODE ASSEMBLY

CROSS REFERENCE TO RELATED APPLICATIONS

The present application claims priority from Japanese patent application JP 2017-076267 filed on Apr. 6, 2017, the content of which is hereby incorporated by reference into this application.

BACKGROUND

Technical Field

The present disclosure relates to an inspection apparatus and an inspection method for a membrane electrode assembly to form a fuel cell.

Background Art

A polymer electrolyte fuel cell includes a membrane electrode assembly (MEA) that includes an electrolyte membrane with ion permeability and anode-side and cathode-side electrode catalyst layers sandwiching the electrolyte membrane therebetween. There is also another concept of a membrane electrode assembly that further includes a gas diffusion layer (GDL) for promoting a flow of gas and increasing the current-collecting efficiency on the outer side of each electrode catalyst layer. In this specification, both of such configurations are included in the types of membrane electrode assembly. The membrane electrode assembly also has separators disposed on opposite sides thereof so that a single fuel cell (single cell) is formed. Such fuel cells are stacked in a number corresponding to the power generation performance so that a fuel cell stack is formed.

Each electrode catalyst layer of such a membrane electrode assembly is mainly formed of a catalyst-supporting carrier that includes a carrier, such as carbon, and catalytic metal, such as platinum, supported on the carrier; and a polymer electrolyte (ionomer) that conducts protons and guides them to the catalytic metal. Therefore, the electrode catalyst layer can be said to be formed of a carbon material. In addition, each gas diffusion layer is also formed of a carbon material, such as graphite or expandable graphite, or a nano-carbon material thereof.

A breakdown voltage test is commonly performed to inspect if a membrane electrode assembly is defective or not. In the breakdown voltage test, if dielectric breakdown of an electrolyte membrane occurs immediately before the application of a test termination voltage thereto, there is a possibility that a current flowing through the electrolyte membrane during the dielectric breakdown may not be detected, and in such a case, the resulting defective product may be circulated. JP 2016-81596 A discloses an inspection method for an electrolyte membrane for a fuel cell that can prevent the circulation of such defective product. Specifically, the method includes a step of applying a voltage to a membrane electrode assembly up to a first voltage level and, if the amount of current flowing through the membrane electrode assembly is less than a first predetermined value, determining that the assembly has passed the breakdown voltage test, a step of holding the assembly having passed the breakdown voltage test at a constant voltage lower than the first voltage level for a predetermined period, and a step of measuring the amount of leakage current of the electrolyte membrane in the assembly and, if the amount of leakage current is greater than a second predetermined value, determining that the assembly is defective. In the predetermined period, the constant voltage is maintained so that the amount of heat generated by the application of the constant voltage becomes less than the amount of energy with which the electrolyte membrane would dissolve.

SUMMARY

With the inspection method for an electrolyte membrane for a fuel cell described in JP 2016-81596 A, it is possible to accurately determine if an electrolyte membrane is defective or not, which has been impossible with the conventional breakdown voltage test, and thus prevent the circulation of defective products.

By the way, there is a concern that a voltage that is applied to a membrane electrode assembly during a breakdown voltage test may cause deterioration of (deterioration of carbon in) an electrode catalyst layer or a gas diffusion layer formed of a carbon material constituting the membrane electrode assembly, which in turn may degrade the performance of the membrane electrode assembly. However, the inspection method described in JP 2016-81596 A does not focus on such deterioration of carbon. It has been found by the inventors that the carbon deterioration rate cannot be identified only from the amount of current or the voltage level. Therefore, it is considered that if the carbon deterioration rate can be identified with high accuracy on the basis of a factor correlated with the carbon deterioration rate, and a membrane electrode assembly with a high carbon deterioration rate can thus be identified as a defective product, for example, it becomes possible to prevent the circulation of defective products even more. The "carbon deterioration rate" as referred to herein is the proportion of the amount of deteriorated carbon relative to the initial amount of carbon forming an electrode catalyst layer or the like.

The present disclosure has been made in view of the foregoing problems, and exemplary embodiments relate to providing an inspection apparatus and an inspection method for a membrane electrode assembly, capable of detecting a defective membrane electrode assembly with high accuracy on the basis of the rate of deterioration of carbon that is a material forming an electrode catalyst layer or the like of the membrane electrode assembly.

Accordingly, an inspection apparatus for a membrane electrode assembly in accordance with the present disclosure is an inspection apparatus for a membrane electrode assembly including at least an electrolyte membrane and anode-side and cathode-side electrode catalyst layers each made of a carbon material so as to form a fuel cell, the inspection apparatus including a voltage application unit configured to apply a voltage to the membrane electrode assembly; and a measurement and operation determination unit configured to measure a time history waveform of a current that flows through the membrane electrode assembly upon application of the voltage thereto for an inspection time and calculate a time integral value of current for the inspection time, and compare the calculated time integral value of current with a threshold of the time integral value of current preset on the basis of a predetermined carbon deterioration rate so as to determine, if the calculated time integral value of current is greater than the threshold, the membrane electrode assembly, which is a target to be inspected, to be defective.

The inspection apparatus for a membrane electrode assembly of the present disclosure is characterized by determining if a membrane electrode assembly is defective or not by calculating the time integral value of current for an inspection time and comparing the calculated time integral value of current with a threshold of the time integral value of current preset on the basis of a predetermined carbon deterioration rate.

Herein, exemplary configurations of a membrane electrode assembly that is a target to be inspected by the inspection apparatus of the present disclosure include a configuration including an electrolyte membrane and anode-side and cathode-side electrode catalyst layers, and a configuration including gas diffusion layers in addition to an electrolyte membrane and electrode catalyst layers.

As described above, each electrode catalyst layer includes a carrier made of a carbon material as its component, and each gas diffusion layer is also made of carbon. It has been identified by the inventors that there is a correlation between the time integral value of current and the carbon deterioration amount or carbon deterioration rate. The carbon deterioration rate, which serves as a criterion for determining if a membrane electrode assembly is defective or not, can be defined as 20%, for example. It has been verified by the inventors that there is an inflection point at a carbon deterioration rate of 20%, and the voltage reduction rate becomes extremely low at a carbon deterioration rate in the range of less than or equal to 20%. It should be noted that the time integral value of current corresponding to the carbon deterioration rate of 20% is 1.9 $C/cm^2$ (herein, C indicates the coulomb). Therefore, when the time integral value of current for an inspection time is greater than 1.9 $C/cm^2$, it follows that the carbon deterioration rate of the component of the membrane electrode assembly is greater than 20%, and such component can thus be determined to be defective. It should be noted that the threshold of the carbon deterioration rate is more preferably defined as 10% which is severer than 20%.

As described above, by determining if a membrane electrode assembly is defective or not on the basis of the carbon deterioration rate correlated with the time integral value of current, it becomes possible to determine if the membrane electrode assembly is defective or not under a given criterion even if the amount of carbon used for the electrode catalyst layer or the like is changed.

The inspection apparatus includes a voltage application unit that includes a power supply, which can freely adjust a voltage to be applied, and electrodes (an anode and a cathode) adapted to be attached to opposite ends of a membrane electrode assembly. When a voltage in a preset voltage range is applied across the anode and the cathode, a current flowing between the electrodes is measured by the measurement and operation determination unit. A voltage that is applied to the membrane electrode assembly by the voltage application unit changes with time, and the amount of current flowing through the membrane electrode assembly also changes along with the change with time of the voltage. In a breakdown voltage test, for example, a high voltage is applied to a membrane electrode assembly and a current is kept flowing through the membrane electrode assembly for an inspection time so that an electrolyte membrane or the like made of a carbon material is oxidized and thus deteriorates. Therefore, it would be impossible to accurately identify the state of deterioration of the electrolyte membrane or the like after a passage of the inspection time only by measuring the amount of current flowing through the membrane electrode assembly and comparing the measured amount of current with a threshold.

The measurement and operation determination unit measures the amount of current flowing through the membrane electrode assembly by sweeping a voltage, and calculates the time integral value of current for an inspection time. Further, the measurement and operation determination unit has stored therein a threshold of the time integral value of current that has been preset on the basis of a predetermined carbon deterioration rate, and compares the calculated time integral value of current with the threshold stored therein so as to determine if the membrane electrode assembly is defective or not.

When the electrolyte membrane or the like made of a carbon material deteriorates, the amount of current flowing through the electrolyte membrane on the basis of a voltage applied thereto will decrease due to leakage and the like, and therefore, the level of a voltage across the electrodes, which sandwich the membrane electrode assembly therebetween, will also decrease with the decrease in the amount of current. As described above, since there is a correlation between the time integral value of current and the carbon deterioration rate, it is possible to determine the carbon deterioration rate by calculating the time integral value of current and thus identify the voltage reduction level (reduction rate) from the determined carbon deterioration rate.

It has been identified by the inventors that when the relative humidity of an inspection chamber in which the inspection apparatus is placed is high, the carbon deterioration amount also becomes large. Therefore, the inspection apparatus preferably further includes a dehumidification unit so that the relative humidity in the inspection chamber is reduced by the dehumidification unit so as to make the atmosphere to a dry atmosphere as much as possible and execute a breakdown voltage test under such dry atmosphere. When a test is conducted under an atmosphere with reduced relative humidity, it is possible to obtain a membrane electrode assembly with suppressed deterioration of carbon resulting from the relative humidity after the test.

Herein, examples of the dehumidification unit include a blower and a dehumidifying agent. When air is forcibly blown into the inspection chamber using a blower or when a dehumidifying agent is disposed within the inspection chamber, the relative humidity in the inspection chamber can be effectively reduced. It should be noted that the dehumidification unit (dehumidification means) can also be implemented by opening a window of the inspection chamber so that the outside air is taken in and blown into the inspection chamber.

Further, an inspection method for a membrane electrode assembly in accordance with the present disclosure is an inspection method for a membrane electrode assembly including at least an electrolyte membrane and anode-side and cathode-side electrode catalyst layers each made of a carbon material so as to form a fuel cell, the method including applying a voltage to the membrane electrode assembly; measuring a time history waveform of a current that flows through the membrane electrode assembly upon application of the voltage thereto for an inspection time; calculating a time integral value of current for the inspection time; and comparing the calculated time integral value of current with a threshold of the time integral value of current preset on the basis of a predetermined carbon deterioration rate so as to determine, if the calculated time integral value of current is greater than the threshold, the membrane electrode assembly, which is a target to be inspected, to be defective.

A flow of the inspection method for a membrane electrode assembly includes conducting a breakdown voltage test of applying a variable high voltage to membrane electrode assemblies and eliminating membrane electrode assemblies that have dielectrically broken down as defective products, continuing the application of a voltage to a membrane electrode assembly that tentatively remains as a non-defective product and calculating the time integral value of current for the inspection time, and comparing the calculated time integral value of current with a threshold preset on the basis of a predetermined carbon deterioration rate so as to finally determine if the membrane electrode assembly is defective or not.

With the inspection method of the present disclosure also, it is possible to obtain, by conducting a test under a dry atmosphere with reduced relative humidity, obtain a membrane electrode assembly with suppressed deterioration of carbon resulting from the relative humidity after the test.

As can be understood from the foregoing description, according to the inspection apparatus and inspection method for a membrane electrode assembly of the present disclosure, it is possible to, by determining if the membrane electrode assembly is defective or not by comparing the time integral value of current for the inspection time with a threshold preset on the basis of the carbon deterioration rate, accurately identify a membrane electrode assembly in which carbon has deteriorated to a level greater than or equal to a threshold after the durability test, and eliminate such an assembly. Therefore, circulation of defective products can be reliably prevented.

DETAILED DESCRIPTION

Figure 1:
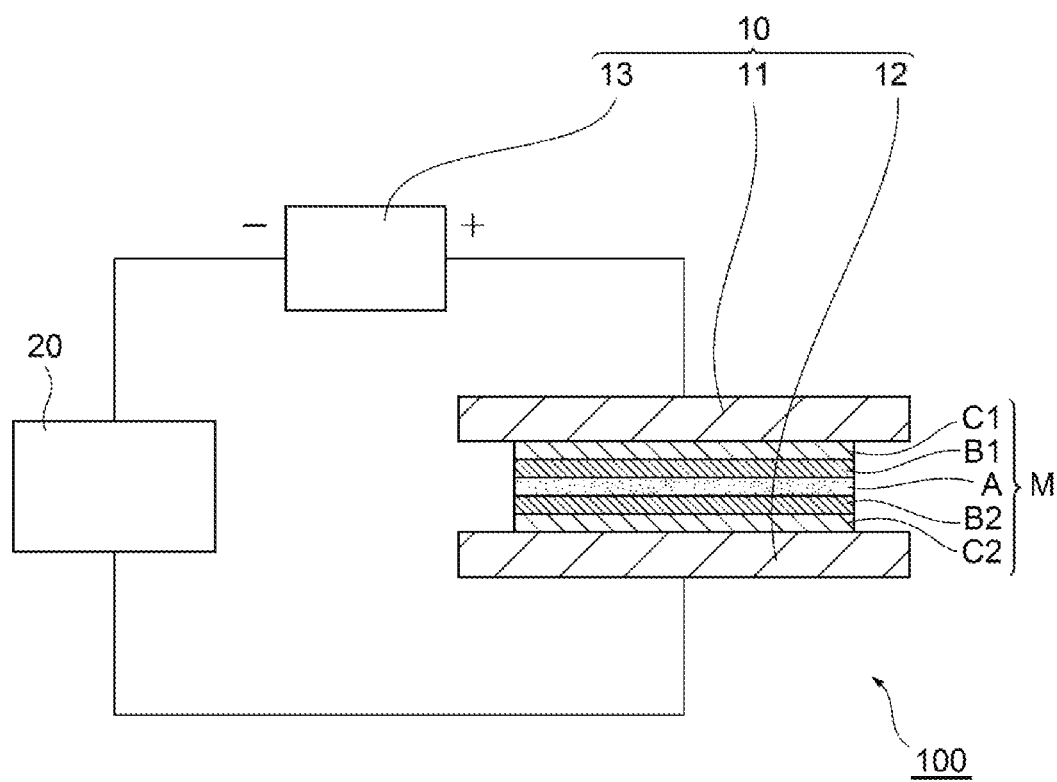
FIG. 1 is a schematic diagram of Embodiment 1 of an inspection apparatus for a membrane electrode assembly of the present disclosure.

Hereinafter, an embodiment of an inspection apparatus and an inspection method for a membrane electrode assembly of the present disclosure will be described with reference to the drawings. Although the inspection apparatus and the inspection method shown in the drawings have a configuration in which a membrane electrode assembly, which is a target to be n inspected, includes an electrolyte membrane, anode-side and cathode-side electrode catalyst layers, and gas diffusion layers sandwiching them, it is also possible to provide a configuration in which a membrane electrode assembly, which is a target to be inspected, includes an electrolyte membrane and electrode catalyst layers.

Figure 2:
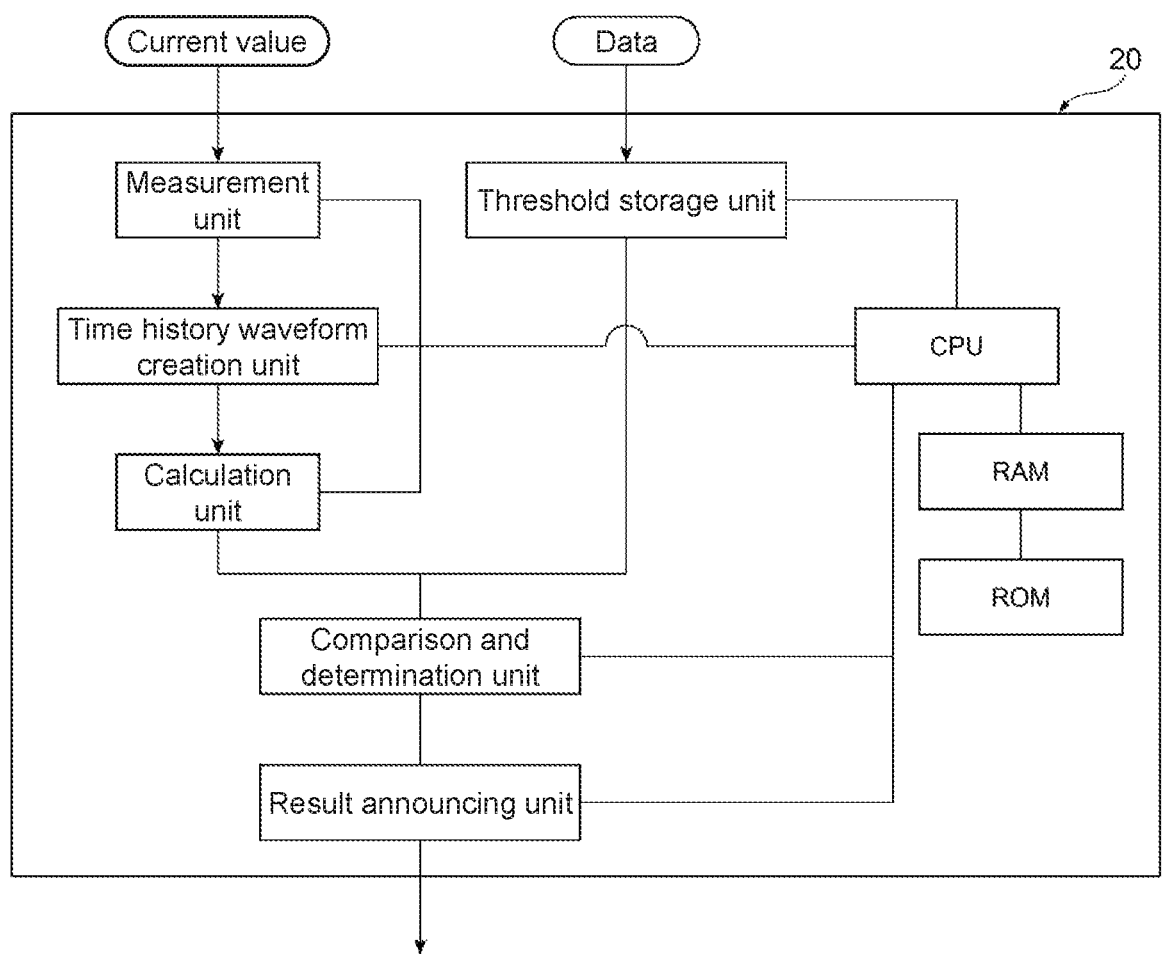
FIG. 2 is a block diagram illustrating the internal configuration of a measurement and operation determination unit.

Embodiment 1 of Inspection Apparatus and Inspection Method for Membrane Electrode Assembly FIG. 1 is a schematic diagram of Embodiment 1 of an inspection apparatus for a membrane electrode assembly of the present disclosure. FIG. 2 is a block diagram illustrating the internal configuration of a measurement and operation determination unit. The inspection apparatus 100 shown in the drawing generally includes a voltage application unit 10 and a measurement and operation determination unit 20.

First, the configuration of a membrane electrode assembly M, which is a target to be inspected, will be described. The membrane electrode assembly M shown in FIG. 1 includes an electrolyte membrane A with ion permeability, anode-side and cathode-side electrode catalyst layers B1 and B2 sandwiching the electrolyte membrane A therebetween, and gas diffusion layers C1 and C2 on the outer sides thereof. The electrolyte membrane A is formed of, for example, a fluorine-based ion exchange membrane containing a sulfonic acid group or a carbonyl group; non-fluorine-based polymers such as substituted phenylene oxide, sulfonated polyaryletherketone, sulfonated polyarylethersulfone, or sulfonated phenylene sulfide, or the like. Meanwhile, the electrode catalyst layers B1, B2 are each formed of a carrier made of a carbon material, such as carbon black, carbon nanotube, or carbon nanofiber; and catalytic metal, such as platinum, platinum alloy, palladium, rhodium, gold, silver, osmium, or iridium, supported on the carrier. Further, the gas diffusion layers C1 and C2 are each formed of a carbon material, such as graphite or expandable graphite, a nano-carbon material thereof, or the like.

The voltage application unit 10 includes a power supply 13 capable of applying a variable voltage, and electrodes including an anode 11 and a cathode 12 adapted to be arranged at opposite ends of the membrane electrode assembly M.

The measurement and operation determination unit 20 includes, as shown in FIG. 2, a measurement unit, a time history waveform creation unit, a calculation unit, a threshold storage unit, a comparison and determination unit, a result announcing unit, a CPU that executes and controls the operation of each unit, RAM, ROM, and the like that are mutually connected via buses.

Figure 3:
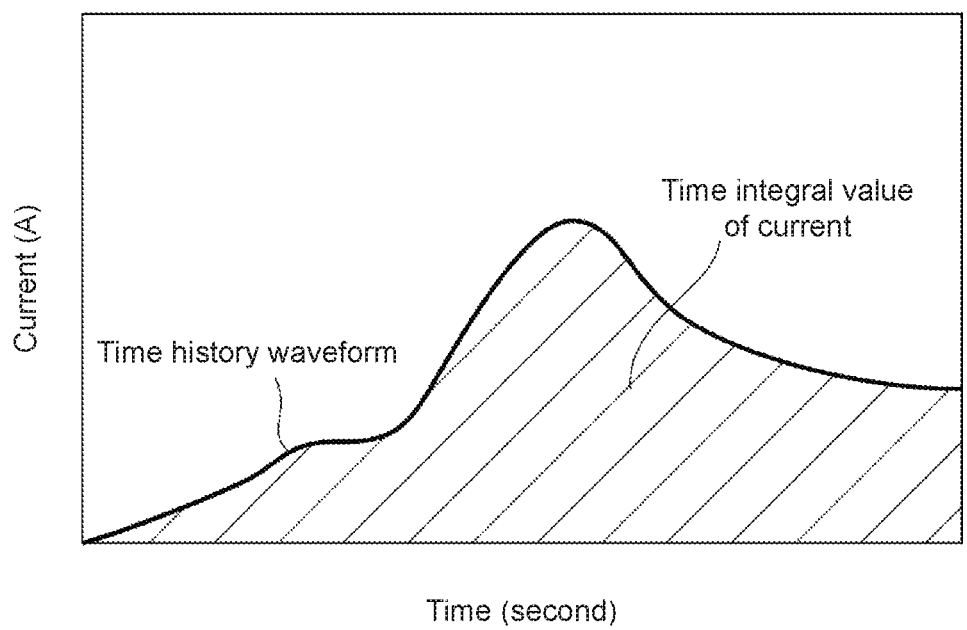
FIG. 3 is a chart illustrating a time history waveform of current measured with the measurement and operation determination unit and the time integral value of current.

When a voltage that changes from moment to moment within a predetermined voltage range is applied to the membrane electrode assembly M, the amount of current at each time point is measured by the measurement unit of the measurement and operation determination unit 20, and a time history waveform of current (see FIG. 3) that is based on the amount of current measured for the inspection time is created by the time history waveform creation unit of the measurement and operation determination unit 20.

The calculation unit of the measurement and operation determination unit 20 calculates the time integral value of current (see FIG. 3) on the basis of the created time history waveform of current.

In addition, the threshold storage unit of the measurement and operation determination unit 20 has stored therein in advance a threshold related to the time integral value of current. The threshold is preset on the basis of the carbon deterioration rate, and is based on the finding of the inventors that there is a correlation between the rate of deterioration of the electrode catalyst layers B1 and B2 and the gas diffusion layers C1 and C2 each made of a carbon material and the time integral value of current. For example, provided that a carbon deterioration rate of 20% is to be preset as a threshold, the time integral value of current corresponding to the carbon deterioration rate of 20% is determined as 1.9 $C/cm^2$ in advance so that the time integral value of current is preset as a threshold.

The comparison and determination unit of the measurement and operation determination unit 20 compares the calculated time integral value of current for the inspection time with the threshold of the time integral value of current determined on the basis of a predetermined carbon deterioration rate.

As a result of comparing the two values, if the calculated time integral value of current for the inspection time is found to be greater than the threshold, it follows that the carbon deterioration rate is greater than the threshold. Therefore, the membrane electrode assembly M, which is the target to be inspected, is determined to be a defective product, and the result is displayed on a computer screen via the result announcing unit or announced to an inspector using an alarm or the like.

Figure 4:
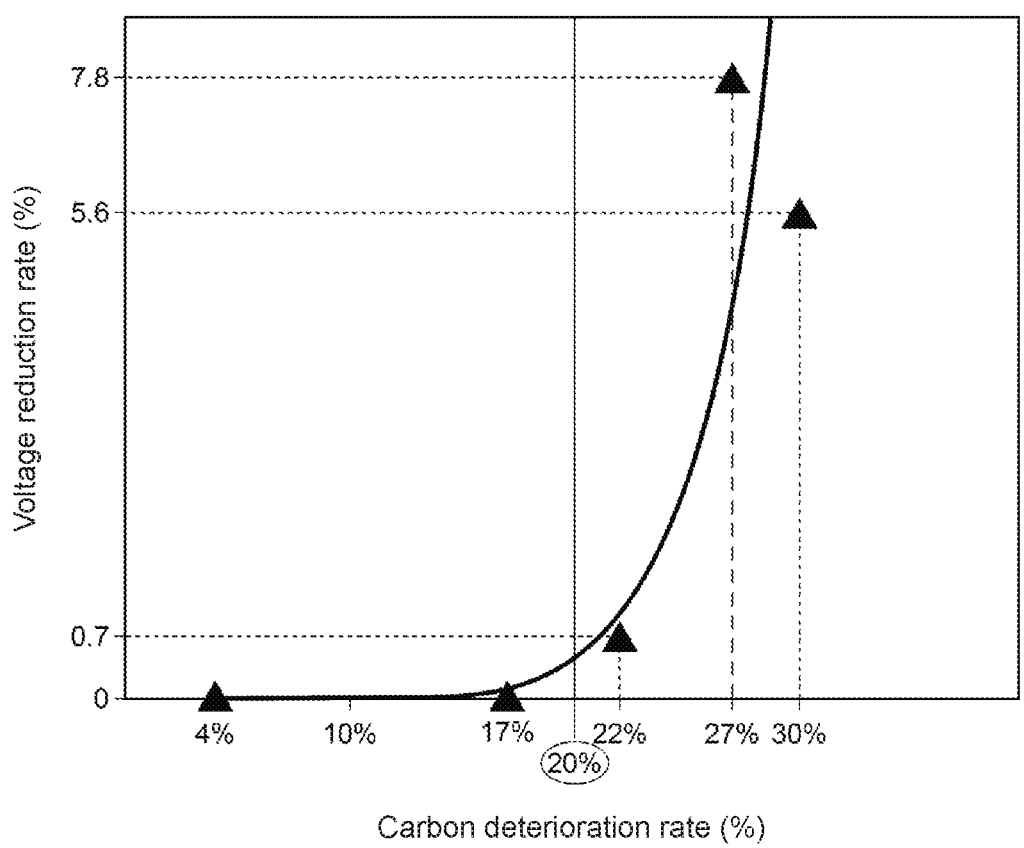
FIG. 4 is a graph showing the relationship between the carbon deterioration rate and the voltage reduction rate.

As shown in FIG. 4, the voltage reduction rate can be represented using a function of an approximate curve having a carbon deterioration rate as a variable, created on the basis of the experimental results of the inventors. When the electrolyte membranes B1, B2 made of carbon materials deteriorate, the amount of current that flows through the electrolyte membranes B1, B2 on the basis of a voltage applied thereto will decrease due to leakage and the like, and therefore, the level of a voltage across the electrodes 11 and 12, which sandwich the membrane electrode assembly M therebetween, will also decrease with the decrease in the amount of current. The voltage reduction rate is the proportion of the differential voltage between the applied voltage (initial voltage) and a voltage identified on the basis of the decreased amount of current relative to the initial voltage ($\Delta V/V$, where $\Delta V$ denotes the differential voltage and V denotes the initial voltage applied).

Herein, a summary of the experiment will be described. The experiment was conducted by sandwiching a membrane electrode assembly M with a size of 1 $cm^2$ with the electrodes 11 and 12, applying a contact pressure of 1 MPa thereto, and applying a voltage at a rate of 0.2 V/second in the room atmosphere while gradually increasing the voltage at a maximum voltage level of 2 V to 5 V.

In FIG. 4, the carbon deterioration rate showing the inflection point of the approximate curve is 20%. Therefore, if the time integral value of current corresponding to the carbon deterioration rate of 20% is preset as a threshold, a membrane electrode assembly M with a low voltage reduction rate can be determined as a quality-approved product.

Further, from FIG. 4, it has been verified that at a carbon deterioration rate of 10%, the voltage reduction rate is almost zero. Therefore, if the time integral value of current corresponding to the carbon deterioration rate of 10% is preset as a threshold, a membrane electrode assembly M with a voltage reduction rate of almost zero can be determined as a quality-approved product.

An inspection method that uses the inspection apparatus 100 is as follows. First, the membrane electrode assembly M, which is a target to be inspected, is disposed between the electrodes 11 and 12 to form the inspection apparatus 100. Then, a voltage that is variable with time is applied to the membrane electrode assembly M by the power supply 13, and a time history waveform of a current that flows through the membrane electrode assembly M upon application of the voltage thereto is measured by the measurement and operation determination unit 20 for the inspection time.

The calculated time integral value of current is compared with the threshold (for example, 1.9 $C/cm^2$) of the time integral value of current preset on the basis of a predetermined carbon deterioration rate (for example, 20%) by the measurement and operation determination unit 20, and if the calculated time integral value of current is greater than the threshold, the membrane electrode assembly M, which is the target to be inspected, is determined to be defective, and if the calculated time integral value of current is less than or equal to the threshold, the membrane electrode assembly M is determined to be not defective.

As described above, according to the inspection apparatus 100 shown in the drawing and the inspection method that uses the inspection apparatus 100, if the membrane electrode assembly M is defective or not is determined by comparing the time integral value of current for the inspection time with the threshold preset on the basis of the carbon deterioration rate. Therefore, it is possible to accurately identify a membrane electrode assembly M in which carbon that is a material forming an electrolyte membrane or the like has deteriorated to a level greater than or equal to the threshold after a durability test and exclude such an assembly, and thus the circulation of defective products can be reliably prevented.

Figure 5:
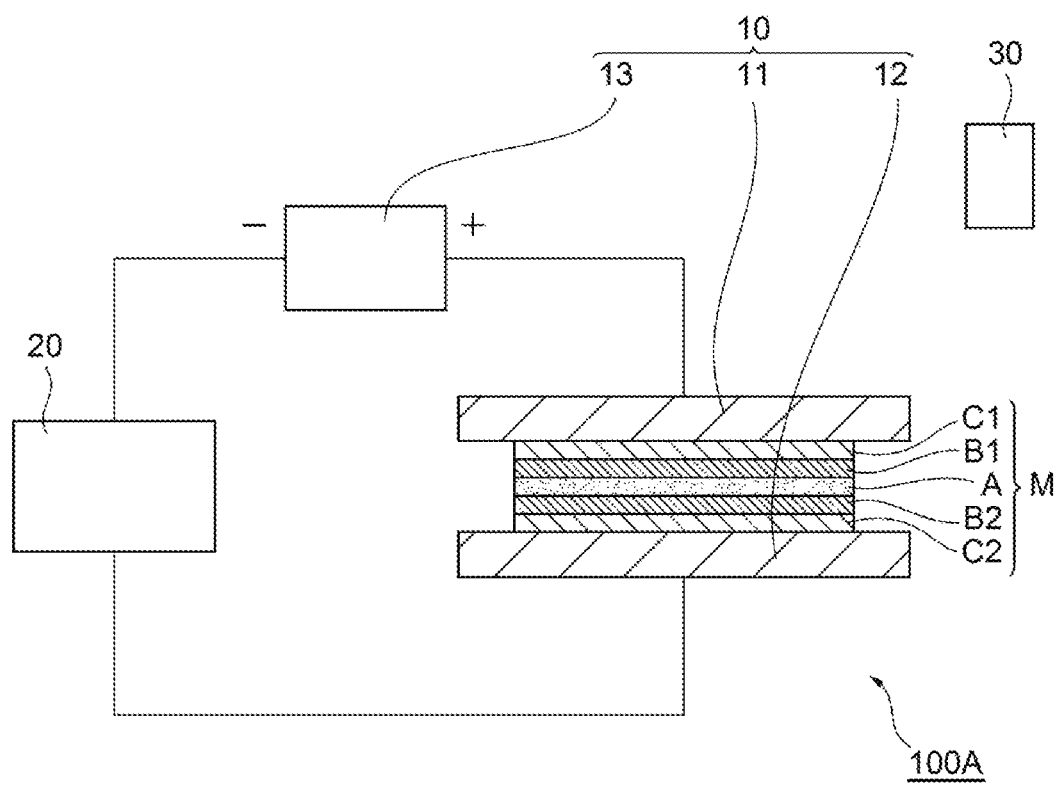
FIG. 5 is a schematic diagram of Embodiment 2 of the inspection apparatus for a membrane electrode assembly of the present disclosure.

Embodiment 2 of Inspection Apparatus and Inspection Method for Membrane Electrode Assembly FIG. 5 is a schematic diagram of Embodiment 2 of the inspection apparatus for a membrane electrode assembly of the present disclosure. An inspection apparatus 100A shown in the drawing is an apparatus that further includes a dehumidification unit 30 in addition to the components of the inspection apparatus 100 shown in FIG. 1.

As the dehumidification unit 30, a blower, a dehumidifying agent, or the like is applicable. When a blower is applied, air is forcibly blown with the blower into an inspection chamber that houses the inspection apparatus 100A therein so as to reduce the relative humidity in the chamber, and when a dehumidifying agent is used, a plurality of dehumidifying agents are attached to the interior of the inspection chamber so as to reduce the relative humidity in the inspection chamber.

It has been identified by the inventors that when the relative humidity of the inspection chamber in which the inspection apparatus 100A is placed is high, the carbon deterioration amount also becomes large. Therefore, when the inspection apparatus 100A has the dehumidification unit 30, the relative humidity in the chamber can be reduced with the dehumidification unit 30, and the interior of the chamber can be set to a dry atmosphere as much as possible. Thus, executing a breakdown voltage test under such a dry atmosphere can suppress the amount of deterioration of carbon as much as possible.

Figure 6:
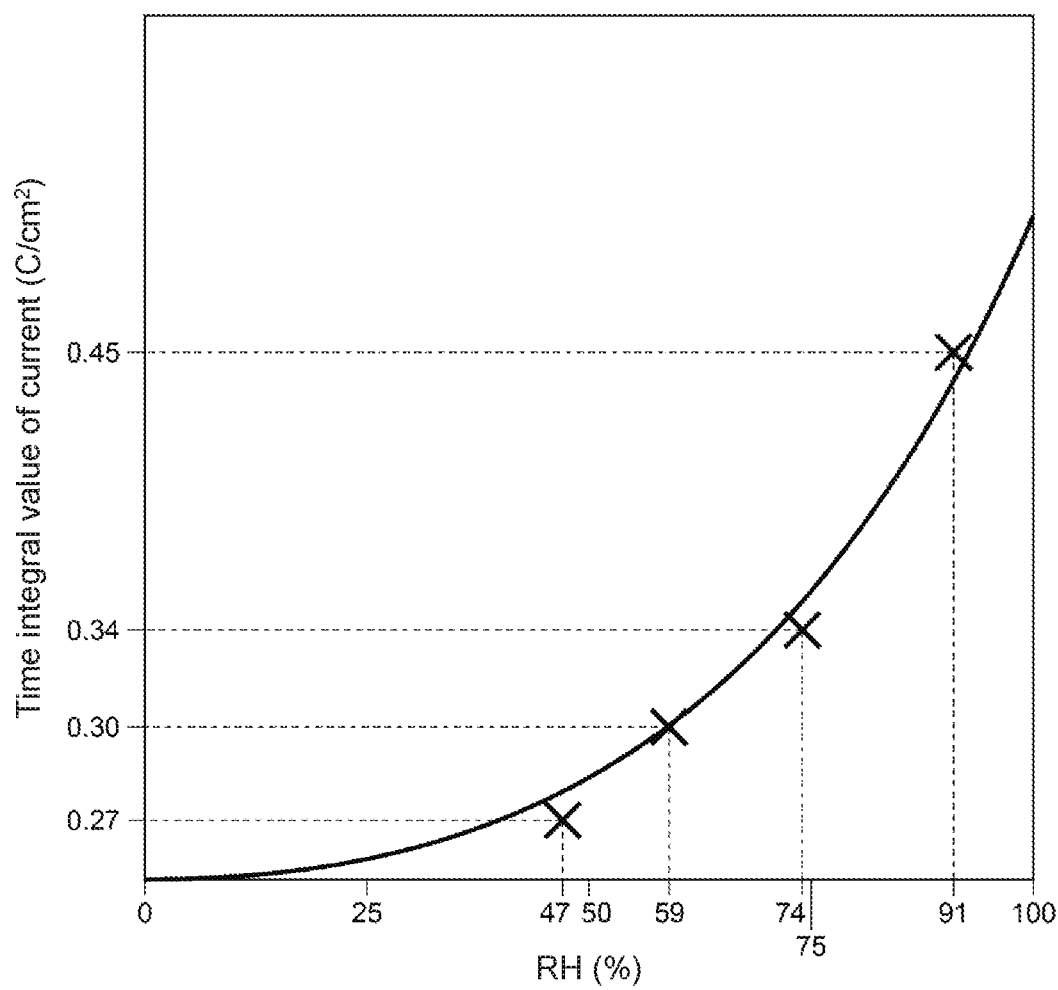
FIG. 6 is a graph that is based on the experimental results identifying the relationship between the relative humidity RH and the time integral value of current.

Herein, FIG. 6 is a graph that is based on the experimental results identifying the relationship between the relative humidity RH and the time integral value of current. Herein, a summary of the experiment will be described. The experiment was conducted by sandwiching a membrane electrode assembly M with a size of 1 $cm^2$ with the electrodes 11 and 12, applying a contact pressure of 1 MPa thereto, and applying a voltage at a rate of 0.5 V/second in the room atmosphere while gradually increasing the voltage at a maximum voltage level of 3 V.

From the graph shown in FIG. 6, it is found that the time integral value of current increases in a quadratic curve manner in accordance with the relative humidity RH during the test. Therefore, if a test is conducted on the membrane electrode assembly M using the inspection apparatus 100A with the dehumidification unit 30, it is possible to suppress the amount of deterioration of carbon resulting from the relative humidity RH and thus obtain a membrane electrode assembly M whose performance degradation due to the test can be suppressed as much as possible after the test.

An inspection method that uses the inspection apparatus 100A is as follows. First, a membrane electrode assembly M, which is a target to be inspected, is disposed between the electrodes 11 and 12 to form the inspection apparatus 100A. Herein, the interior of the inspection chamber is set to a dry atmosphere with reduced relative humidity by the dehumidification unit 30 that is a component of the inspection apparatus 100A. Then, a voltage that is variable with time is applied to the membrane electrode assembly M by the power supply 13, and a time history waveform of a current that flows through the membrane electrode assembly M upon application of the voltage thereto is measured by the measurement and operation determination unit 20 for the inspection time.

The calculated time integral value of current is compared with the threshold of the time integral value of current preset on the basis of a predetermined carbon deterioration rate by the measurement and operation determination unit 20, and if the calculated time integral value of current is greater than the threshold, the membrane electrode assembly M, which is the target to be inspected, is determined to be defective, and if the calculated time integral value of current is less than or equal to the threshold, the membrane electrode assembly M is determined to be not defective.

Although the embodiments of the present disclosure have been described in detail above with reference to the drawings, specific configurations are not limited thereto, and design changes and the like that may occur within the spirit and scope of the present disclosure are all included in the present disclosure.

DESCRIPTION OF SYMBOLS

10 Voltage application unit
11 Anode (electrode)
12 Cathode (electrode)
13 Power supply
20 Measurement and operation determination unit
30 Dehumidification unit
100, 100A Inspection apparatus (inspection apparatus for membrane electrode assembly)
M Membrane electrode assembly

What is claimed is:

1. An inspection apparatus for a membrane electrode assembly, the membrane electrode assembly including at least an electrolyte membrane and anode-side and cathode-side electrode catalyst layers each made of a carbon material so as to form a fuel cell, the inspection apparatus comprising:
    a voltage application unit configured to apply a voltage to the membrane electrode assembly; and
    a measurement and operation determination unit configured to measure a time history waveform of a current that flows through the membrane electrode assembly upon application of the voltage thereto for an inspection time and calculate a time integral value of current for the inspection time, and compare the calculated time integral value of current with a threshold of the time integral value of current preset on the basis of a predetermined carbon deterioration rate so as to determine, if the calculated time integral value of current is greater than the threshold, the membrane electrode assembly, which is a target to be inspected, to be defective.

2. The inspection apparatus according to claim 1, further comprising a dehumidification unit.

3. An inspection method for a membrane electrode assembly including at least an electrolyte membrane and anode-side and cathode-side electrode catalyst layers each made of a carbon material so as to form a fuel cell, the method comprising:
    applying a voltage to the membrane electrode assembly;
    measuring a time history waveform of a current that flows through the membrane electrode assembly upon application of the voltage thereto for an inspection time;
    calculating a time integral value of current for the inspection time; and
    comparing the calculated time integral value of current with a threshold of the time integral value of current preset on the basis of a predetermined carbon deterioration rate so as to determine, if the calculated time integral value of current is greater than the threshold, the membrane electrode assembly, which is a target to be inspected, to be defective.

4. The inspection method for a membrane electrode assembly according to claim 3, wherein the inspection of the membrane electrode assembly is conducted under a dry atmosphere with reduced relative humidity.

* * * * *